(12) United States Patent
Ann et al.

(10) Patent No.: US 11,960,787 B2
(45) Date of Patent: Apr. 16, 2024

(54) VEHICLE AND CONTROL METHOD THEREOF

(71) Applicants: HYUNDAI MOTOR COMPANY, Seoul (KR); KIA CORPORATION, Seoul (KR)

(72) Inventors: Yun Sup Ann, Hwaseong-si (KR); Hyunsang Kim, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 309 days.

(21) Appl. No.: 17/354,799

(22) Filed: Jun. 22, 2021

(65) Prior Publication Data

US 2022/0058378 A1 Feb. 24, 2022

(30) Foreign Application Priority Data

Aug. 18, 2020 (KR) ........................ 10-2020-0103492

(51) Int. Cl.
*G06F 3/16* (2006.01)
*B60Q 1/24* (2006.01)
*B60Q 1/32* (2006.01)
*B60Q 1/50* (2006.01)
*G06V 20/56* (2022.01)
(Continued)

(52) U.S. Cl.
CPC ............. *G06F 3/165* (2013.01); *B60Q 1/247* (2022.05); *B60Q 1/32* (2013.01); *B60Q 1/543* (2022.05); *B60Q 1/547* (2022.05); *G06F 3/167* (2013.01); *G06V 20/56* (2022.01); *G06V 40/172* (2022.01); *G06V 40/50* (2022.01); *G06V 40/67* (2022.01); *G10L 21/0216* (2013.01); *B60Q 2400/20* (2013.01); *B60Q 2400/40* (2013.01); *B60Q 2400/50* (2013.01); *G10L 2021/02163* (2013.01)

(58) Field of Classification Search
CPC ......... G06F 3/165; G06F 3/167; B60Q 1/247; B60Q 1/32; B60Q 1/543; B60Q 1/547; B60Q 1/2665; B60Q 1/0023; B60Q 1/0088; B60Q 1/24; B60Q 2400/20; B60Q 2400/40; B60Q 2400/50; G06V 20/56; G06V 40/172; G06V 40/50; G06V 40/67; G10L 21/0216; G10L 21/0316; G10L 2021/02163; H03G 3/32; B60R 25/25; B60R 25/305; B60R 25/31; B60R 25/1001; B60R 25/24; B60R 25/34; B60R 11/04; B60J 1/12; H04R 2499/13
See application file for complete search history.

(56) References Cited

U.S. PATENT DOCUMENTS

2011/0013812 A1\* 1/2011 Shin .......................... G07C 9/37
382/118
2014/0219519 A1\* 8/2014 Yuasa .................. G06V 40/172
382/118

(Continued)

*Primary Examiner* — Edward F Urban
*Assistant Examiner* — Wassim Mahrouka
(74) *Attorney, Agent, or Firm* — SLATER MATSIL, LLP

(57) ABSTRACT

A vehicle and control method of the vehicle are provided. The vehicle includes a camera provided on the vehicle and configured to capture an image of an object outside the vehicle, a controller configured to determine a photographing position required for facial recognition from the captured image, a guide configured to guide the photographing position, and a display configured to display a result of the facial recognition.

18 Claims, 9 Drawing Sheets

(51) Int. Cl.
    *G06V 40/16*     (2022.01)
    *G06V 40/50*     (2022.01)
    *G06V 40/60*     (2022.01)
    *G10L 21/0216*     (2013.01)

(56) References Cited

U.S. PATENT DOCUMENTS

| | | | |
|---|---|---|---|
| 2017/0180616 A1* | 6/2017 | Friedman | G06V 40/168 |
| 2019/0077372 A1* | 3/2019 | Greenberg | B60K 35/00 |
| 2019/0180017 A1* | 6/2019 | Takashima | G06V 40/172 |
| 2020/0249764 A1* | 8/2020 | Page | G06V 10/82 |
| 2021/0287469 A1* | 9/2021 | Ryhorchuk | G06V 40/172 |
| 2022/0012588 A1* | 1/2022 | Rhee | G06N 3/04 |
| 2022/0410709 A1* | 12/2022 | Florentz | B60K 35/00 |

* cited by examiner

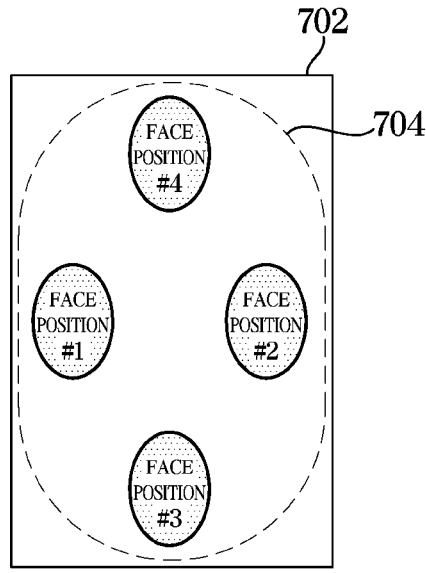
FIG. 7A  FACE POSITION
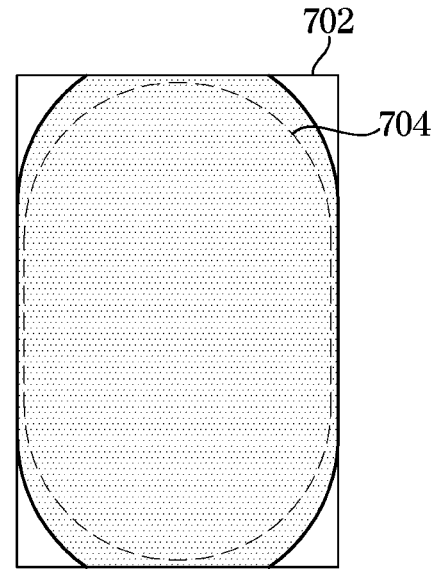
FIG. 7B  FACE SIZE
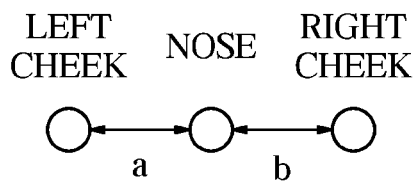
FIG. 7C  NOT BIASED (a=b)
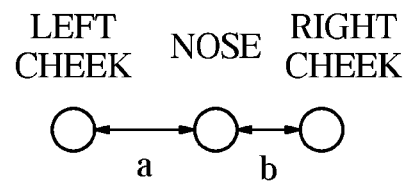
FIG. 7D  BIASED (a≠b)

FIG. 9

| RECOGNITION SITUATION | VOICE GUIDANCE | LED INDICATOR GUIDANCE |
|---|---|---|
| REGISTRATION SUCCESS | FACE INFORMATION REGISTRATION IS COMPLETE. | LED LIGHTS UP IN GREEN |
| REGISTRATION FAILURE | FACE INFORMATION REGISTRATION FAILED. | LED LIGHTS UP IN RED. |
| GUIDE TO MOVE IN FRONT OF THE CAMERA (IF THERE IS NO FACE INFORMATION ON SCREEN) | MOVE IN FRONT OF B-PILLAR CAMERA AND STARE AT FRONT OF CAMERA. | — |
| FACIAL DIRECTION MISALIGNMENT SITUATION (FACIAL DIRECTION ALIGNMENT GUIDE) | POINT YOUR FACE TOWARDS FRONT OF CAMERA | — |
| WHEN FACE IS PRESENT BUT DISTANCE IS FAR | FACE IS TOO FAR. PLEASE MOVE SLIGHTLY FORWARD. | — |
| WHEN FACE IS PRESENT BUT DISTANCE IS CLOSE | FACE IS TOO CLOSE. PLEASE MOVE SLIGHTLY BACKWARD. | — |
| WHEN FACE POSITION IS BIASED TO LEFT SO THAT REGISTRATION IS IMPOSSIBLE | PLEASE MOVE YOUR FACE SLIGHTLY TO RIGHT | LEFT BIAS INDICATION |
| WHEN FACE POSITION IS BIASED TO RIGHT SO THAT REGISTRATION IS IMPOSSIBLE | PLEASE MOVE YOUR FACE SLIGHTLY TO LEFT | RIGHT BIAS INDICATION |
| WHEN FACE POSITION IS BIASED UPWARD THAT REGISTRATION IS IMPOSSIBLE | PLEASE MOVE YOUR FACE SLIGHTLY DOWNWARDS | UPWARD BIAS INDICATION |
| WHEN FACE POSITION IS BIASED DOWNWARD THAT REGISTRATION IS IMPOSSIBLE | PLEASE MOVE YOUR FACE SLIGHTLY UPWARDS | DOWNWARD BIAS INDICATION |

VEHICLE AND CONTROL METHOD THEREOF

CROSS-REFERENCE TO RELATED APPLICATION

This application is claims priority to and the benefit of Korean Patent Application No. 10-2020-0103492, filed on Aug. 18, 2020, the disclosure of which is incorporated herein by reference in its entirety.

TECHNICAL FIELD

The present disclosure relates to a vehicle, and driver registration and facial recognition of the vehicle.

BACKGROUND

In the vehicle's convenience function for the driver (passenger), the driver's face is registered in advance, and the driver's face is recognized when the driver is boarded in the future to authenticate the registration, unlock the door, and automatically adjust the seat position and steering wheel position.

The camera must be mounted on the outside of the vehicle in order for the driver to take a facial for facial recognition before boarding. However, it is not allowed to install a display or speaker to be exposed to the outside of the vehicle for outputting various guidance comments provided to the driver in the process of driver registration or facial recognition.

Therefore, it may be difficult to hear or see the guidance messages generated inside the vehicle while photographing the face through the camera outside the vehicle while the driver gets off the vehicle, resulting in great inconvenience.

In addition, when the driver's face is photographed through a camera outside the vehicle while getting off the vehicle, it is not known whether the driver's own face is preferably photographed. Therefore, photographing at the level required for facial recognition may not be possible, which may cause a decrease in the facial recognition rate.

SUMMARY

According to an aspect of the present disclosure, a desirable photographing position can be guided when photographing the driver's face through a camera mounted outside the vehicle. In addition, when the driver's face is photographed from the outside of the vehicle, the guidance message output from the inside of the vehicle can be well transmitted to the outside of the vehicle.

In accordance with one aspect of the disclosure, a vehicle includes: a camera provided on the vehicle to photograph a subject outside the vehicle; a controller configured to determine a photographing position required for facial recognition from an image photographed by the camera; a guide mean for guiding the photographing position required for the facial recognition; and a display configured to display a result of the facial recognition.

The controller may be a facial recognition controller configured to perform a control for a facial registration and a facial recognition of a user of the vehicle.

The guide mean may be a puddle lamp provided to display the photographing position required for the facial recognition on the ground around the vehicle by irradiating a light around the vehicle.

The display may be an LED light source provided to display a progress or a result of the facial recognition by lighting in different colors.

The controller may be configured to output a voice guidance related to the facial recognition through a speaker inside the vehicle while performing the facial recognition.

The controller may be configured to open a window of the vehicle so that the voice guidance is transmitted to a user outside the vehicle and control the degree of opening of the window in consideration of rainfall when it rains, and set the degree of opening of the window to a preset minimum state and increase the volume of the voice guidance when the rainfall exceeds a preset amount when it rains.

The vehicle may further include: a microphone configured to measure noise outside the vehicle, and the controller may be configured to adjust the volume of the voice guidance according to the level of noise measured through the microphone.

The camera and the display may be mounted to be exposed to the outside of the vehicle.

In accordance with another aspect of the disclosure, a control method of a vehicle includes: photographing, by a camera provided on the vehicle, a subject outside the vehicle; determining, by a controller, a photographing position required for facial recognition from an image photographed by the camera; guiding, by a guide mean, the photographing position required for the facial recognition; and displaying, by a display, a result of the facial recognition.

The controller may be a facial recognition controller configured to perform a control for a facial registration and a facial recognition of a user of the vehicle.

The guiding the photographing position may include: displaying, by a puddle lamp, the photographing position required for the facial recognition on the ground around the vehicle by irradiating a light around the vehicle.

The displaying the result of the facial recognition may include: displaying, by an LED light source, a progress or a result of the facial recognition by lighting in different colors.

The control method may further include: outputting a voice guidance related to the facial recognition through a speaker inside the vehicle while performing the facial recognition.

The control method may further include: opening a window of the vehicle so that the voice guidance is transmitted to a user outside the vehicle and controlling the degree of opening of the window in consideration of rainfall when it rains; and setting the degree of opening of the window to a preset minimum state and increasing the volume of the voice guidance when the rainfall exceeds a preset amount when it rains.

The vehicle may further include a microphone configured to measure noise outside the vehicle, and the method may further include: adjusting the volume of the voice guidance according to the level of noise measured through the microphone.

The camera and the display may be mounted to be exposed to the outside of the vehicle.

DRAWINGS

These and/or other aspects of the disclosure will become apparent and more readily appreciated from the following description of the forms, taken in conjunction with the accompanying drawings of which:

FIGS. 7A, 7B, 7C, and 7D are views illustrating the concept of checking the position, size, and direction of a face when photographing a user's face.

FIGS. 8A, 8B, 8C, 8D, 8E, and 8F are views illustrating a guide of a facial photographing state using an LED indicator in a facial recognition module of a vehicle in one form of the present disclosure.

FIG. 9 is a view illustrating an example of a voice guidance message output from user registration and facial recognition of a vehicle in one form of the present disclosure.

DETAILED DESCRIPTION

Figure 1:
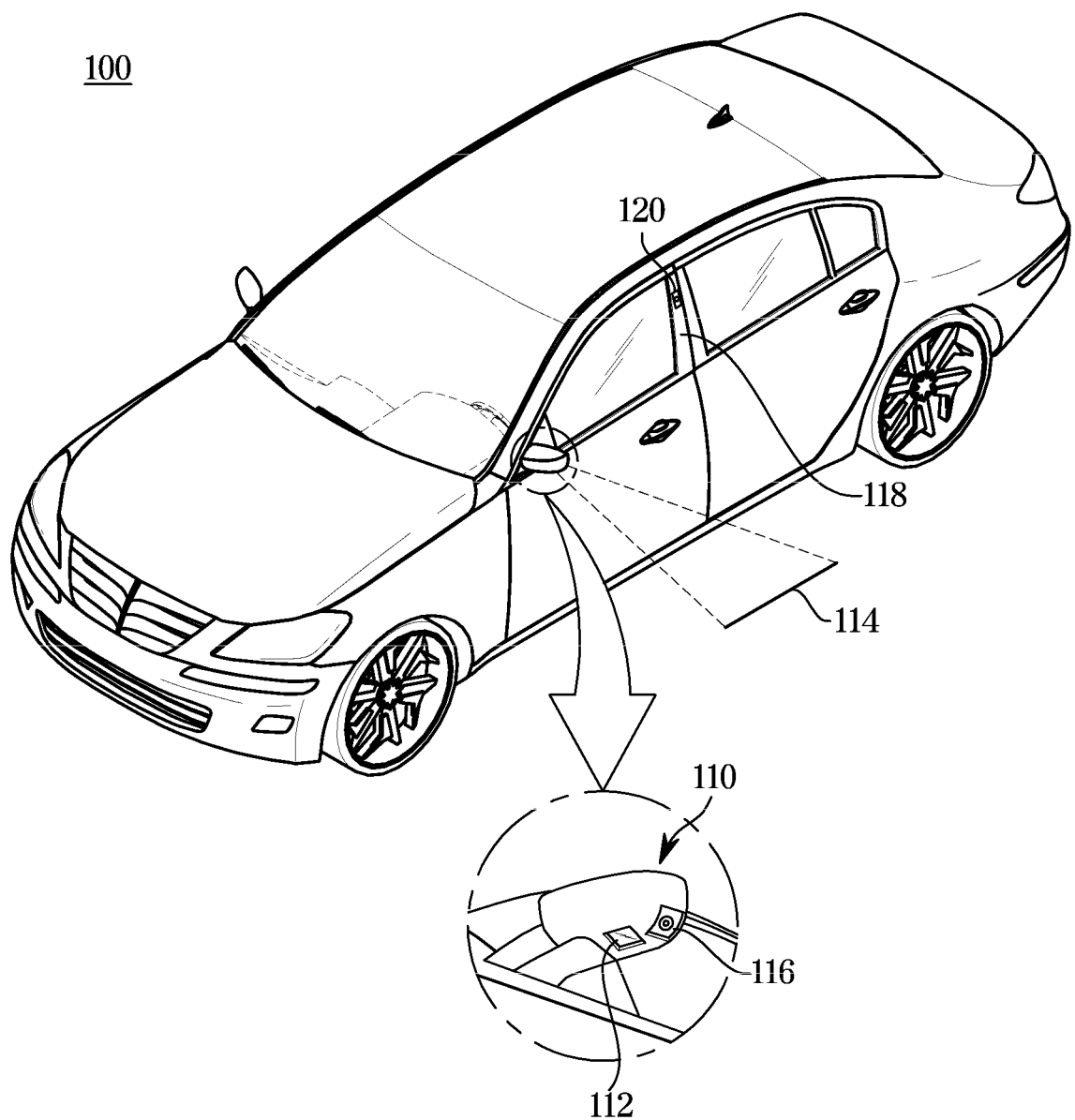
FIG. 1 is a view illustrating a vehicle in one form of the present disclosure.

FIG. 1 is a view illustrating a vehicle in some forms of the present disclosure. The vehicle 100 shown in FIG. 1 externally has the following structure.

Figure 3:
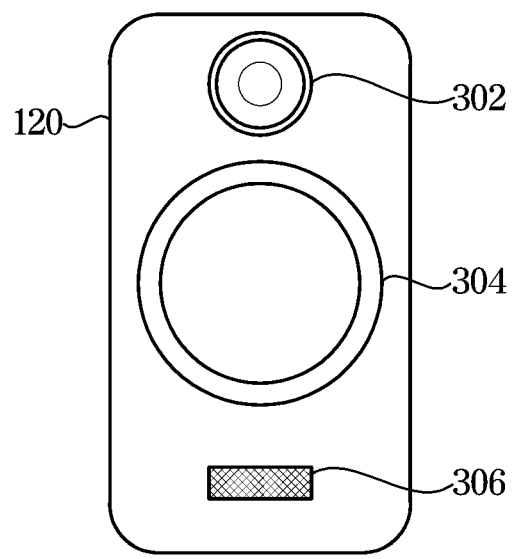
FIG. 3 is a view illustrating a facial recognition module of another vehicle in one form of the present disclosure.

As shown in FIG. 1, the outside mirror 110 on the driver's seat side of the vehicle 100 includes a puddle lamp 112, and an Around View Monitoring Camera (116). The puddle lamp 112 is a light source for illuminating the surroundings of the vehicle 100. In addition, the puddle lamp 112 is also a guide means for displaying an optimal photographing position of a user required for facial recognition on the ground around the vehicle, as shown in FIG. 3 to be described later.

The puddle lamp 112 illuminates a certain area around the vehicle 100 when the user carrying the key of the vehicle 100 approaches the vehicle 100 within a preset distance, and allows a user to conveniently board the vehicle 100 even at dark nights.

The around view camera 116 is for photographing the surroundings of the vehicle 100 from various directions, and is provided to photograph various directions around the vehicle 100 by mounting a plurality of cameras at various positions of the vehicle 100. The images in various directions photographed in this way are combined into one and displayed on the display inside the vehicle 100, so that the user of the vehicle can monitor the outside of the vehicle 100 even indoors.

In addition, a facial recognition camera module 120 is provided on the driver's seat door frame 118 of the vehicle 100 in some forms of the present disclosure. The facial recognition camera module 120 is a device for photographing and registering the face of a user (subject), and recognizing and authenticating the face of a user (subject) who intends to board after registration. The facial recognition camera module 120 in some forms of the present disclosure will be described in more detail with reference to FIG. 3 to be described later.

In the vehicle 100 in some forms of the present disclosure, a photographing guide line 114 is displayed (projected) on the ground around the driver's seat door using a puddle lamp 112. This will be described in detail with reference to FIG. 2.

Figure 2:
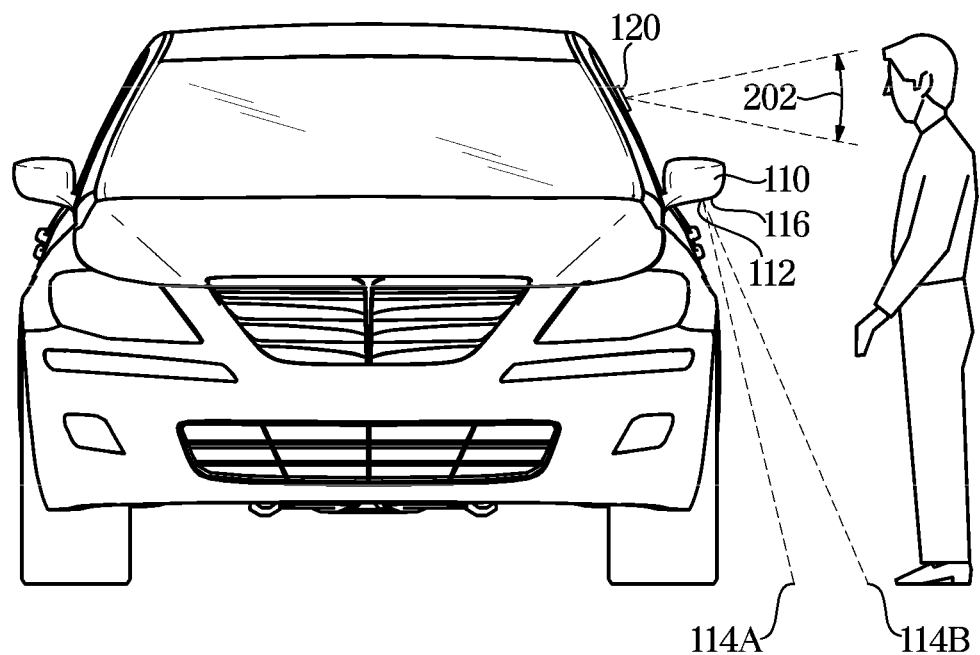
FIG. 2 is a view illustrating a guide line for facial recognition of a vehicle in one form of the present disclosure.

FIG. 2 is a view illustrating a guide line for facial recognition of a vehicle in some forms of the present disclosure.

Previously, it has been described that the guide line 114 for guiding the photographing position for facial recognition/registration of the user to be boarded is displayed using the puddle lamp 112. When the light source of the puddle lamp 112 is turned on, a guide line 114 may be formed on the ground according to the shape of a straight band by forming a straight band on the transparent case surface in front of the light source of the puddle lamp 112 on the path through which the light travels when the puddle lamp 112 is turned on.

In FIG. 2, two guide lines 114A and 114B are shown, and the guide line indicated by the reference numeral 114A is a reference guide line preset in the vehicle 100. This guide line 114A is formed at a position away from the driver's door (the side of the vehicle) by a distance preset by the vehicle manufacturer. The guide line indicated by reference numeral 114B is a guide line that reflects the actual photographing position that the user stood for photographing during facial registration. In the vehicle 100 in some forms of the present disclosure, when a user who has already registered for facial recognition wants to board the vehicle 100, the photographing position (position of 114B) in which the user stood in the registration step is memorized. In addition, by displaying the corresponding photographing position through the puddle lamp 112, by inducing the user's photographing position (114B position) in the pre-registration process and the user's photographing position in the future facial recognition process to match each other, the user's facial recognition rate is greatly improved. The position of the guide line 114B, which reflects the actual photographing position the user stood for during facial registration, can be determined through analysis of the image of the position where the user stood when photographing for facial registration captured through the around-view camera 116. That is, when photographing for facial registration or facial recognition, the user's position can be confirmed from the image captured through the around view camera 116.

Since the camera of the facial recognition module 120 (302 in FIG. 3) has an angle of view 202 at a certain angle, the face may be photographed too large or too small depending on where the user is standing and photographing the face. Therefore, by displaying a preset guide line 114A or a guide line 114B indicating an actual photographing position as shown in FIGS. 1 and 2 through the puddle lamp 112 to guide the optimal photographing position, facial photographing optimized for facial registration/recognition can be performed.

FIG. 3 is a view illustrating a facial recognition module of another vehicle in some forms of the present disclosure.

As shown in FIG. 3, the facial recognition module 120 of the vehicle 100 in some forms of the present disclosure includes a camera module 302, an LED indicator 304, and a microphone 306.

The camera module 302 is a device for photographing a user's face for registration/recognition of the user's face. The camera module 302 may include a lens, an image sensor, and a control circuit. The camera module 302 may be an infrared camera.

The LED indicator 304 is a display for displaying the progress or result of facial recognition, and may be a ring-shaped light source (eg, an LED light source). The LED indicator 304 may be lit in a plurality of different colors. For example, when facial recognition/registration is successful, it is lit green so that the user knows that facial recognition/ registration is successful. Or, if facial recognition/registration fails, it lights in red so that the user knows that the facial recognition/registration has failed. Alternatively, a part of the top/bottom/left/right of the ring-shaped LED indicator 304 is turned on and the remaining part is turned off, so that the user can know that the user's face is biased toward any one of the photographing area during photographing. This will be described in more detail with reference to FIG. 9 to be described later. Guidance related to facial recognition may also be provided in the form of a voice guidance through a speaker provided in the interior of the vehicle 100 (see 422 in FIG. 4).

The microphone 306 is a device for measuring the degree of noise around the vehicle 100. In the vehicle 100 in some forms of the present disclosure, when a voice guidance is output through a speaker inside the vehicle 100 to a user located outside the vehicle 100 for facial photographing during facial registration, voice guidance is output in a volume suitable for the noise level by measuring external noise through the microphone 306. For example, as the external noise measured through the microphone 306 increases, the volume of voice guidance increases.

Figure 4:
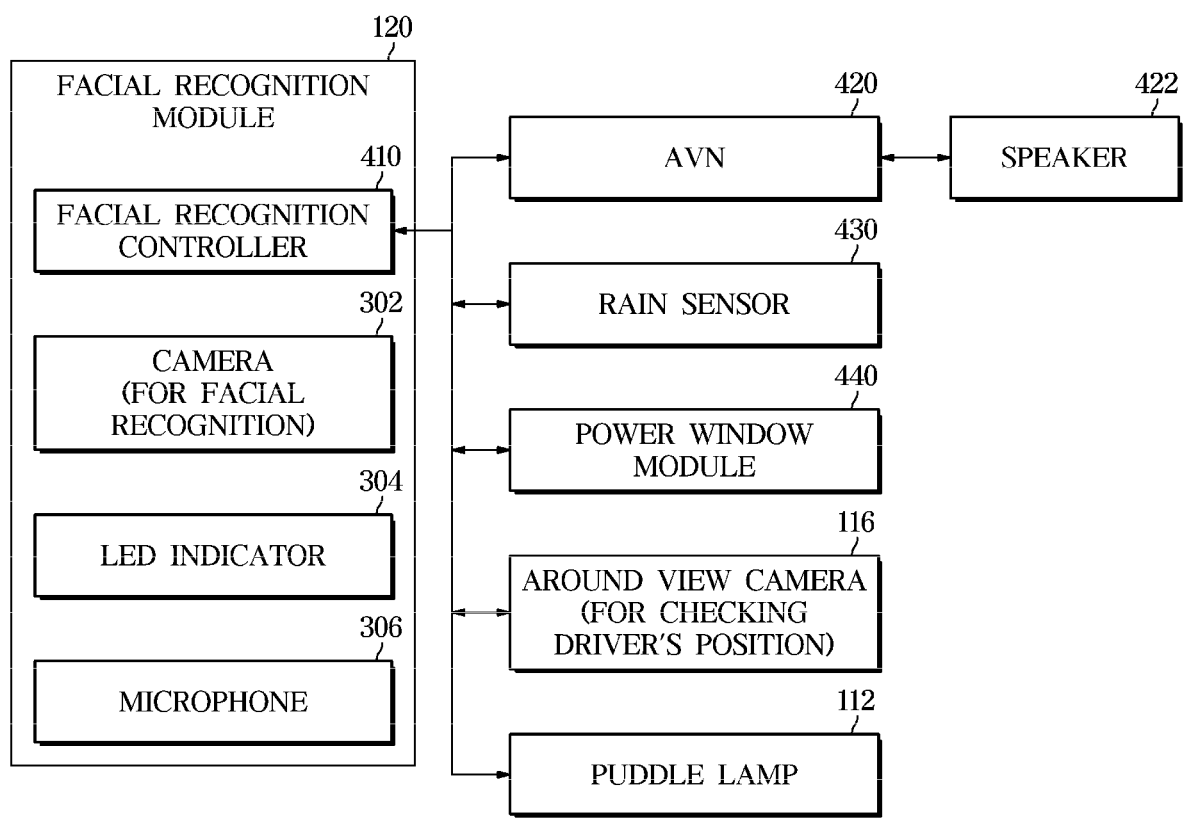
FIG. 4 is a view illustrating a control system of a vehicle in one form of the present disclosure.

FIG. 4 is a view illustrating a control system of a vehicle in some forms of the present disclosure.

As shown in FIG. 4, the facial recognition module 120 further includes a facial recognition controller 410 in addition to the camera 302, LED indicator 304, and microphone 306 previously described in FIGS. 1 to 3. The facial recognition controller 410 is a microprocessor, and controls the overall operation for facial registration and facial recognition of the user. The facial recognition controller 410 performs the operation of the facial recognition module 120 itself, and communicates and controls the AVN 420, the rain sensor 430, the power window module 440, the around view camera 116, and the puddle lamp 112 through cooperation with other ECU (Electronic Control Unit) of vehicle 100.

The AVN 420 is a multimedia device, and may perform a user registration menu for facial recognition. In addition, voice guidance generated during the user registration/recognition process may be output through the speaker 422.

The rain sensor 430 is provided to measure rainfall when it rains. In the vehicle 100 in some forms of the present disclosure, when registering a user for facial recognition, the window of the vehicle 100 is opened so that the voice guidance output from the inside of the vehicle 100 is sufficiently well transmitted to the user positioned outside the vehicle 100. If the window is opened in rainy weather, rainwater may hit the inside of the vehicle 100, the facial recognition controller 410 measures whether it rains and rainfall through the rain sensor 430 and determines whether to open the window or the degree of opening considering whether it rains and rainfall. When it's not raining, the window is open enough to be needed. Or, even if it rains, even if the rainfall is insignificant, the window is open enough to be needed. If there is too much rainfall when it rains (i.e. exceeding the preset amount) and it is difficult to open the window sufficiently, the degree of opening of the window may be minimized (ie, a preset minimum open state), and the volume of the AVN 420 may be increased instead, so that a voice guidance message having a sufficiently large volume may be output through the speaker 422.

The power window module 440 is a device in which a window of the vehicle 100 is opened or closed by driving a motor. In the vehicle 100 according to the present disclosure, the power window module 440 is controlled by the control of the facial recognition controller 410 to open or close the window.

The around view camera 116 and the puddle lamp 112 have been previously described with reference to FIGS. 1 and 2.

Figure 5:
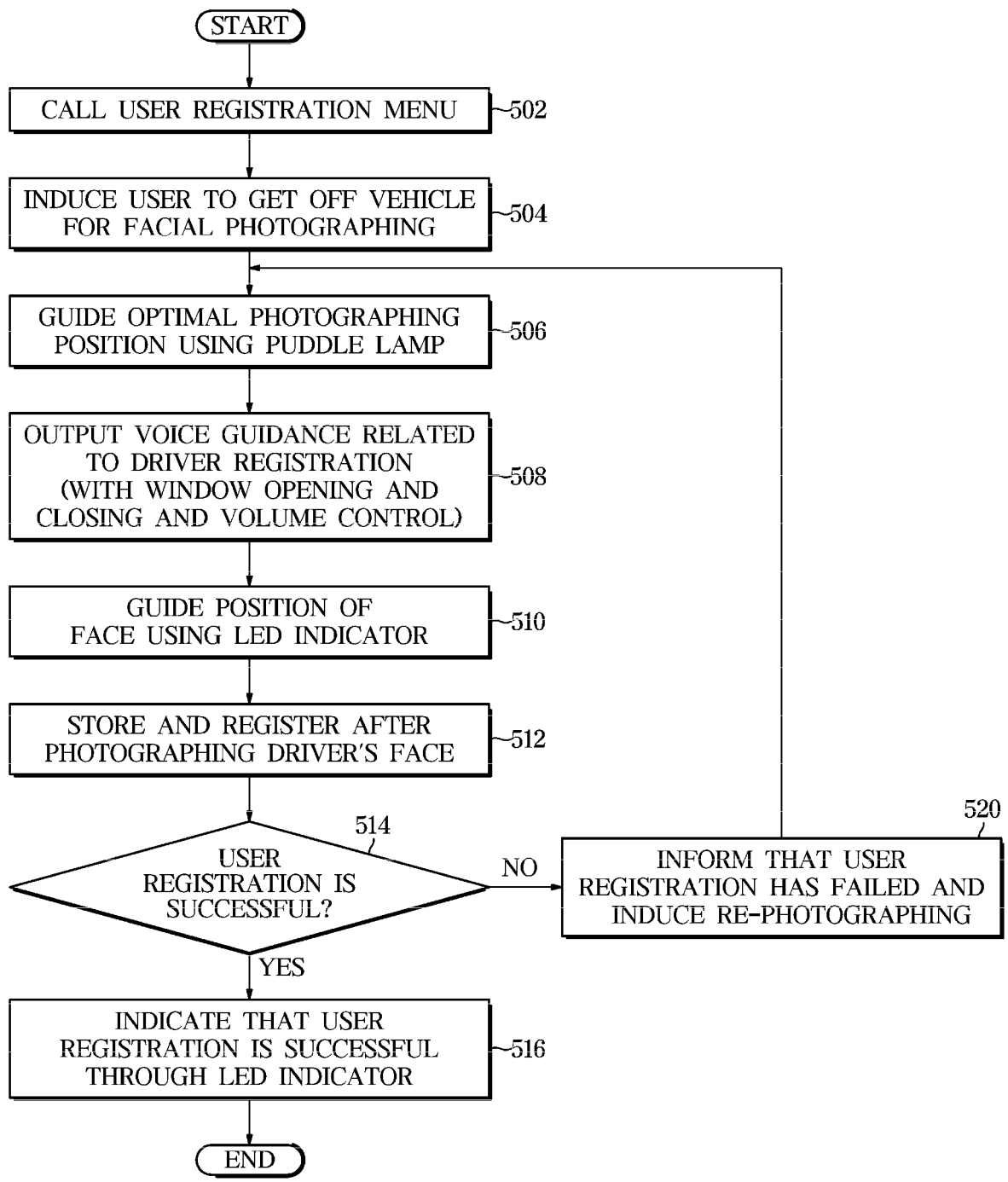
FIG. 5 is a view illustrating a user registration method for facial recognition of a vehicle in one form of the present disclosure.

FIG. 5 is a view illustrating a user registration method for facial recognition of a vehicle in some forms of the present disclosure. The user registration method shown in FIG. 5 shows a process of registering as a user of the vehicle 100 by photographing a face by a user through the facial recognition module 120.

As shown in FIG. 5, when a user calls the user registration menu to AVN 420 while boarding the vehicle 100 in order to register himself as a user of the vehicle 100, the user registration menu is executed in the AVN 420 (502).

In response to the execution of the user registration menu in the AVN 420, the facial recognition controller 410 guides the user boarding the vehicle 100 to get off the vehicle 100 for facial photographing (504). Inducing the user to get off the vehicle may be performed in the form of a message through the display of the AVN 420 or may be performed in the form of voice guidance through the speaker 422.

When the user gets off the vehicle 100, the facial recognition controller 410 lights the puddle lamp 112 mounted on the outside mirror 110 to display a guide line 114 for facial photographing on the ground around the driver's door. Through this, the facial recognition controller 410 guides the optimal standing position in which the user should stand for facial photographing (506). The guide line 114 displayed at this time is a reference guide line 114A previously set in the vehicle 100.

Thereafter, the facial recognition controller 410 outputs a guide message to be transmitted to the user until the user registration is completed in the form of a voice guidance message through the speaker 422 connected to the AVN 420 (508). The user can listen to the voice guidance message output through the speaker 422 inside the vehicle 100 and take an action (operation) required by the user for user registration. Since the display device cannot be mounted on the outer surface of the vehicle 100 by law, it is impossible to output a guide message through the display device. Therefore, it is preferable to output a guide message required for user registration in the form of a voice guidance message through the speaker 422 inside the vehicle 100. A preferred form of the voice guidance message will be described in more detail with reference to FIG. 9 to be described later.

At this time, when registering a user for facial recognition, The facial recognition controller 410 may open the window of the vehicle 100 so that the voice guidance output from the inside of the vehicle 100 is sufficiently well transmitted to the user positioned outside the vehicle 100. If the window is opened in rainy weather, rainwater may hit the inside of the vehicle 100, the facial recognition controller 410 measures whether it rains and rainfall through the rain sensor 430 and determines whether to open the window or the degree of opening considering whether it rains and rainfall. When it's not raining, the window is open enough to be needed. Or, even if it rains, even if the rainfall is insignificant, the window is open enough to be needed. If there is too much rainfall when it rains and it is difficult to open the window sufficiently, the degree of opening of the window may be minimized, and the volume of the AVN 420 may be increased instead, so that a voice guidance message having a sufficiently large volume may be output through the speaker 422.

In addition, while the user's facial photographing is in progress, the facial recognition controller 410 guides the position of the face currently being photographed to the user through the LED indicator 304 of the facial recognition module 120 (510). For a high facial recognition rate, both the photographed image in the registration stage and the photographed image in the recognition stage must be of good quality. That is, for a high recognition rate, each face image photographed in the registration and recognition steps needs to be of an appropriate size facing the front. Therefore, the facial recognition controller 410 analyzes the image of the user's face being photographed and checks whether the user's face is facing the front, and whether the user's face is biased toward either of the top/bottom/left/right sides of the photographing area. The facial recognition controller 410 displays the confirmation result through the LED indicator 304 so that the user can recognize the current photographing state.

FIGS. 7A, 7B, 7C and 7D are views illustrating the concept of checking the position, size, and direction of a face when photographing a user's face. Here, reference numeral 702 indicates an entire image area, and reference numeral 704 indicates a region of interest, that is, a region considered for facial recognition in the entire image area. As shown in FIG. 7A, if the user's photographed face is biased toward either left/right/top/bottom of the region of interest 704, accurate facial recognition may be difficult. In addition, as shown in FIG. 7B, if the user's photographed face is too large to be out of the region of interest 704 (shaded portion), accurate facial recognition may be difficult.

In addition, in order to obtain a desirable image, the user must face the camera 302 and photograph his or her face. That is, as shown in FIG. 7C, when the user looks straight at the camera 302, the distance between the left cheek, the nose, and the right cheek in the image of the user's face is the same. In contrast, if the distance between the left cheek and the nose and the right cheek in the image of the user's face is not the same as in FIG. 7D, this means that the user does not look directly at the camera 302 and the direction of the user's face with respect to the camera 302 is wrong. Therefore, in the case of FIG. 7D, it is possible to guide the user to look at the camera 302 straight.

FIGS. 8A, 8B, 8C, 8D, 8E and 8F are views illustrating a guide of a facial photographing state using an LED indicator in a facial recognition module of a vehicle in some forms of the present disclosure.

Figure 8A:
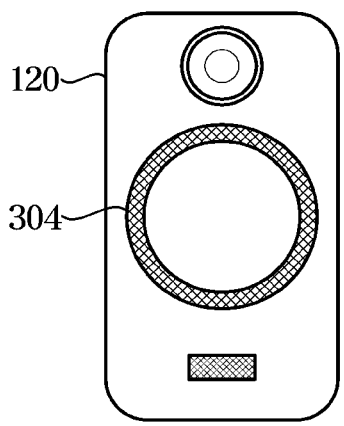
Figure 8B:
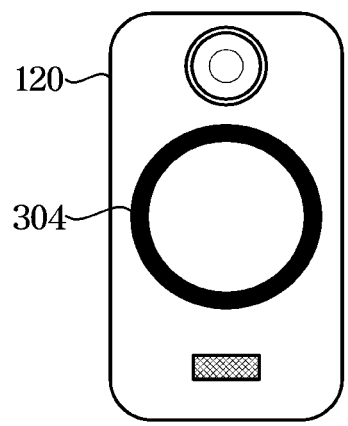
Figure 8C:
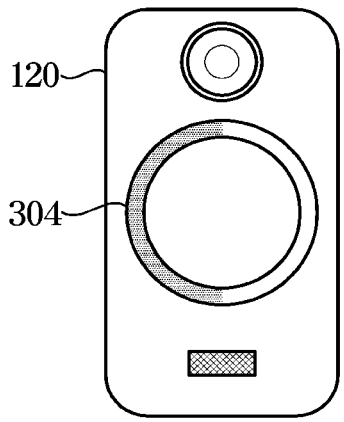
Figure 8D:
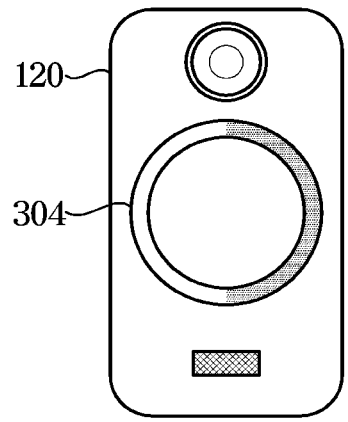
Figure 8E:
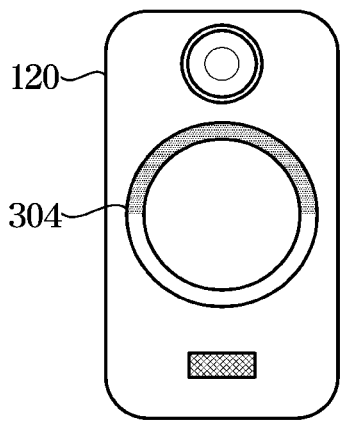
Figure 8F:
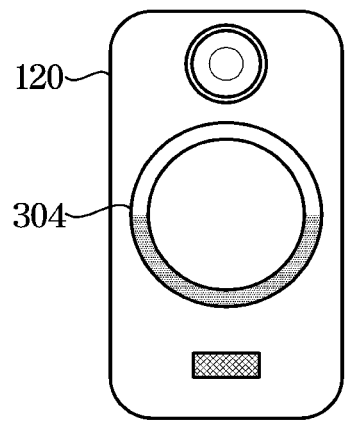

FIGS. 8C, 8D, 8E, and 8F show the lighting state of the LED indicator 304 for informing the user that the user's photographed face is biased left/right/up/down of the region of interest 704, respectively. FIG. 8C shows that the user's face is biased to the left of the region of interest 704. The user can recognize that his or her face is biased to the left of the ROI 704 through the lighting state of the LED indicator 304. In this case, the facial recognition controller 410 may guide the user's face to slightly move to the right through voice guidance. FIG. 8D shows that the user's face is biased to the right of the region of interest 704. The user can recognize that his or her face is biased to the right side of the ROI 704 through the lighting state of the LED indicator 304. In this case, the facial recognition controller 410 may guide the user's face to move slightly to the left through voice guidance. FIG. 8E shows that the user's face is biased to the top of the region of interest 704. The user can recognize that his or her face is biased to the top of the ROI 704 through the lighting state of the LED indicator 304. In this case, the facial recognition controller 410 may guide the user's face to move slightly downward through voice guidance. FIG. 8F shows that the user's face is biased to the bottom of the region of interest 704. The user can recognize that his or her face is biased toward the lower portion of the ROI 704 through the lighting state of the LED indicator 304. In this case, the facial recognition controller 410 may guide the user's face to slightly move upward through voice guidance.

Returning to FIG. 5 again, when the user's face is photographed at an appropriate position in the center of the region of interest 704, the facial recognition controller 410 stores the photographed image and registers it in the facial recognition module 120 (512). At this time, the facial recognition controller 410 recognizes the position (standing position, 114B in FIGS. 1 and 2) in which the user stood for facial photographing through the around-view camera 116, and stores the recognized position as the user's optimal standing position along with other registration information of the user. At this time, the standing position stored may be used as an optimal standing position to induce the user to stand when performing facial recognition to board the vehicle 100 in the future. In other words, by remembering the optimal position for facial photographing and guiding the position to the standing position in the future facial recognition process, even during facial recognition, the optimal facial photographing can be achieved as in the case of facial registration.

If the user registration is successful like this ('Yes' in 514), the facial recognition controller 410 may indicate that user registration is successful through the LED indicator 304 (516). In FIG. 8 described above, FIG. 8A is a view showing a state in which the LED indicator 304 is lit green when user registration is successfully performed. As described above, through the LED indicator 304 lit green, the user can recognize that his/her user registration has been successfully performed. Alternatively, if user registration fails, the LED indicator 304 may be lit red, as shown in FIG. 8B. In this way, through the LED indicator 304 lit in red, the user can recognize that user registration has failed.

Again, returning to FIG. 5, if the user registration fails ('No' in 514), the facial recognition controller 410 informs that the user registration has failed through the LED indicator 304 and induces re-photographing for user registration (520). At this time, the facial recognition controller 410 may return to the step of guiding a desired photographing position to the user by turning on the puddle lamp 112 again, and repeating the processes of 506 to 512 previously described.

Figure 6:
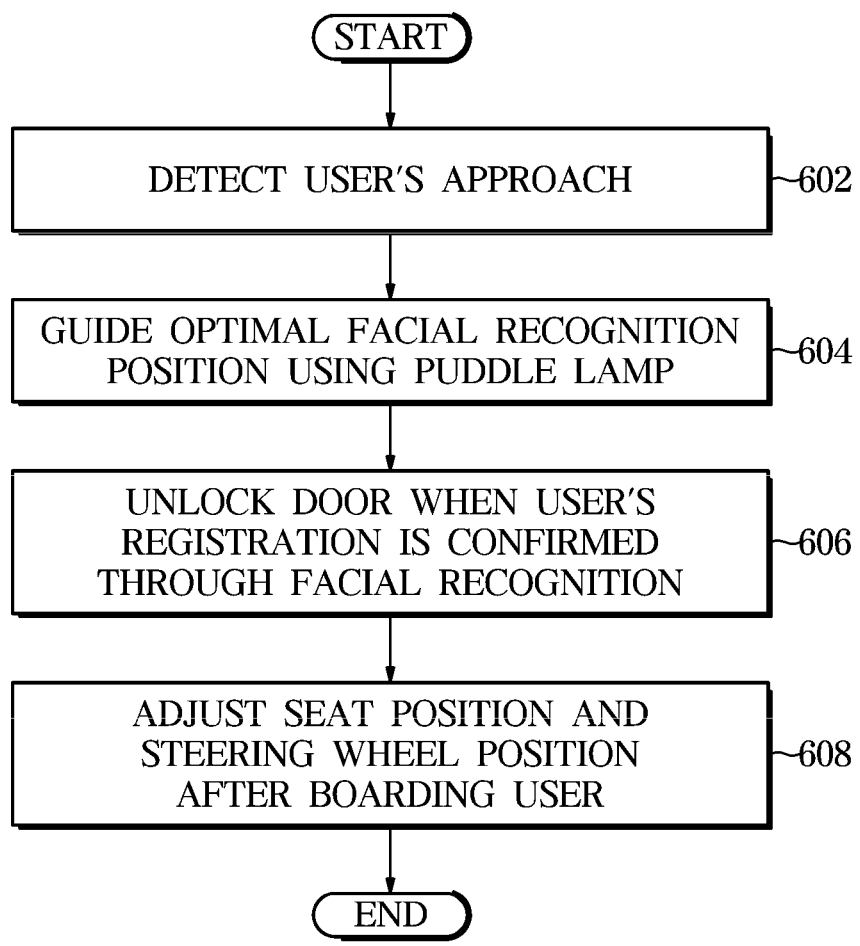
FIG. 6 is a view illustrating a method for facial recognition of a vehicle in one form of the present disclosure.

FIG. 6 is a view illustrating a method for facial recognition of a vehicle in some forms of the present disclosure. The facial recognition method of FIG. 6 is performed on the premise that the user has already registered the user through the method shown in FIG. 5.

As shown in FIG. 6, when the user approaches the vehicle 100 within a certain distance while carrying the key, the facial recognition module 120 detects the user's approach (602), and turns on the puddle lamp 112 to guide the optimal facial recognition position (604). At this time, the optimal facial recognition position presented by the facial recognition controller 410 may be any one of the preset guide line 114A mentioned in the description of FIGS. 1 and 2 or the guide line 114B indicating a position in which an actual photograph was taken during the user registration process.

When the user's registration is confirmed through facial recognition (that is, when authentication is made), the facial recognition controller 410 may request another ECU (eg BCU) of the vehicle 100 to unlock the door of the vehicle 100 (606). In addition, the facial recognition controller 410 may request adjustment of the driver's seat position and the steering wheel position as previously set for the user after boarding the user.

FIG. 9 is a view illustrating an example of a voice guidance message output from user registration and facial recognition of a vehicle in some forms of the present disclosure. As shown in FIG. 9, by outputting various voice guidance messages and lighting the LED indicator 304 in the pre-user registration process for facial recognition and the actual facial recognition process after user registration, user registration for facial recognition and guidance messages required in the process of facial recognition can be effectively delivered to users.

The above description is merely illustrative of the technical idea, and a person with ordinary knowledge in the technical field of the present disclosure will be able to make various modifications, changes, and substitutions within the range not departing from the essential characteristics. Accordingly, the disclosed forms and the accompanying drawings are not intended to limit the technical idea, but to describe the technical idea, and the scope of the technical idea is not limited by these forms and the accompanying drawings. The scope of protection should be interpreted by the scope of the claims below, and all technical ideas within the scope of the same should be construed as being included in the scope of the rights.

According to an aspect of the present disclosure, a desirable photographing position can be guided when photographing the driver's face through a camera mounted outside the vehicle. In addition, when the driver's face is photographed from the outside of the vehicle, the guidance message output from the inside of the vehicle can be well transmitted to the outside of the vehicle.

What is claimed is:

1. A vehicle comprising:
   a camera provided on the vehicle and configured to capture an image of a user outside the vehicle, the camera having a plurality of photographing areas;
   a controller configured to determine a photographing position required for facial recognition from the captured image;
   a guide configured to guide the photographing position; and
   an indicator having top/bottom/left/right parts and being configured to display a result of the facial recognition by lighting in a plurality of different colors to indicate success or failure of the facial recognition, the indicator configured to indicate that a face of the user is biased toward any one of the photographing areas of the camera by turning on a part of the top/bottom/left/right of the indicator and turning off remaining parts of the indicator,
   wherein the controller is configured to:
      open a window of the vehicle to transmit a voice guidance to the user outside the vehicle;
      control a degree of opening of the window depending on a rain condition; and
      set the degree of opening of the window to a preset minimum state and increase a volume of the voice guidance when a rainfall exceeds a preset amount.

2. The vehicle according to claim 1, wherein the controller is further configured to control a facial registration and a facial recognition of the user.

3. The vehicle according to claim 1, wherein the guide further comprises a puddle lamp configured to display the photographing position on a ground around the vehicle by irradiating a light around the vehicle.

4. The vehicle according to claim 1, wherein the indicator comprises an LED light source configured to display the result of the facial recognition by lighting in the different colors.

5. The vehicle according to claim 1, further comprising a speaker inside the vehicle, wherein the controller is configured to output the voice guidance associated with the facial recognition through the speaker.

6. The vehicle according to claim 5, further comprising a microphone configured to measure noise outside the vehicle, wherein the controller is configured to adjust the volume of the voice guidance according to the measured noise.

7. The vehicle according to claim 1, wherein the camera and the indicator are mounted on an outside of the vehicle.

8. A control method of a vehicle, the method comprising:
   capturing, by a camera provided on the vehicle, an image of a user outside the vehicle, the camera having a plurality of photographing areas;
   determining, by a controller, a photographing position required for facial recognition from the captured image;
   guiding the photographing position;
   displaying a result of the facial recognition by lighting an indicator in a plurality of different colors to indicate success or failure of the facial recognition, the indicator having top/bottom/left/right parts;
   using the indicator to indicate that a face of the user is biased toward any one of the photographing areas of the camera by turning on a part of the top/bottom/left/right of the indicator and turning off remaining parts of the indicator,
   opening a window of the vehicle to transmit a voice guidance to the user outside the vehicle;
   controlling a degree of opening of the window depending on a rain condition; and
   setting the degree of opening of the window to a preset minimum state and increasing a volume of the voice guidance when a rainfall exceeds a preset amount.

9. The control method according to claim 8, further comprising controlling a facial registration and a facial recognition of a user of the vehicle.

10. The control method according to claim 8, wherein guiding the photographing position comprises displaying, by a puddle lamp, the photographing position on a ground around the vehicle by irradiating a light around the vehicle.

11. The control method according to claim 8, wherein displaying the result of the facial recognition by lighting in different colors.

12. The control method according to claim 8, further comprising outputting the voice guidance associated with the facial recognition through a speaker inside the vehicle.

13. The control method according to claim 12, further comprising:
   measuring, by a microphone, a noise outside the vehicle; and
   adjusting the volume of the voice guidance according to the measured noise through the microphone.

14. The control method according to claim 8, wherein the camera and the indicator are mounted on an outside of the vehicle.

15. A vehicle comprising:
   a camera mounted on an outside of the vehicle and configured to capture an image of a user outside the vehicle, the camera having a plurality of photographing areas;
   a speaker inside the vehicle;
   a controller configured to determine a photographing position required for facial recognition from the captured image, to open a window of the vehicle to transmit voice guidance to the user outside the vehicle, to control a degree of opening of the window depending on a rain condition, and to set the degree of opening of the window to a preset minimum state and increase a volume of the voice guidance when a rainfall exceeds a preset amount;

a puddle lamp configured to guide the photographing position by irradiating a light around the vehicle; and an indicator mounted on the outside of the vehicle and having top/bottom/left/right parts, the indicator configured to display a result of the facial recognition by lighting in a plurality of different colors to indicate success or failure of the facial recognition and to indicate that a face of the user is biased toward any one of the photographing areas of the camera by turning on a part of the top/bottom/left/right of the indicator and turning off remaining parts of the indicator.

16. The vehicle according to claim 15, wherein the controller is further configured to control a facial registration and a facial recognition of the user.

17. The vehicle according to claim 15, wherein the indicator comprises an LED light source configured to display the result of the facial recognition by lighting in the different colors.

18. The vehicle according to claim 15, further comprising a microphone configured to measure noise outside the vehicle, wherein the controller is configured to adjust the volume of the voice guidance according to the measured noise.

* * * * *